(12) United States Patent
Moon et al.

(10) Patent No.: US 10,671,473 B2
(45) Date of Patent: Jun. 2, 2020

(54) CLOCK RECOVERY SYSTEM OF DISPLAYS APPARATUS

(71) Applicant: SILICON WORKS CO., LTD., Daejeon-si (KR)

(72) Inventors: Yong Hwan Moon, Goyang-si (KR); Yong Ik Jung, Bucheon-si (KR); In Seok Kong, Goyang-si (KR); Jun Ho Kim, Goyang-si (KR)

(73) Assignee: Silicon Works Co., Ltd., Daejeon-si (KR)

( * ) Notice: Subject to any disclaimer, the term of this patent is extended or adjusted under 35 U.S.C. 154(b) by 195 days.

(21) Appl. No.: 15/848,246

(22) Filed: Dec. 20, 2017

(65) Prior Publication Data

US 2018/0173585 A1    Jun. 21, 2018

(30) Foreign Application Priority Data

Dec. 21, 2016 (KR) .......................... 10-2016-0175461

(51) Int. Cl.
| | | |
|---|---|---|
| *G06F 11/07* | (2006.01) | |
| *H03K 5/156* | (2006.01) | |
| *H03K 3/00* | (2006.01) | |
| *G09G 3/20* | (2006.01) | |
| *G09G 5/00* | (2006.01) | |

(52) U.S. Cl.
CPC ...... *G06F 11/0793* (2013.01); *G06F 11/0736* (2013.01); *G06F 11/0757* (2013.01); *G09G 3/20* (2013.01); *H03K 3/00* (2013.01); *H03K 5/1565* (2013.01); *G09G 5/008* (2013.01); *G09G 2310/027* (2013.01); *G09G 2310/08* (2013.01); *G09G 2370/08* (2013.01)

(58) Field of Classification Search
CPC ..................................................... G09G 5/008
See application file for complete search history.

(56) References Cited

U.S. PATENT DOCUMENTS

| | | | |
|---|---|---|---|
| 9,361,825 B2 | 6/2016 | Jeong et al. | |
| 2010/0293405 A1* | 11/2010 | Shen .......................... | G06F 1/08 |
| | | | 713/401 |
| 2011/0037758 A1* | 2/2011 | Lim ....................... | H03L 7/0805 |
| | | | 345/213 |

FOREIGN PATENT DOCUMENTS

| | | |
|---|---|---|
| KR | 10-2013-0074567 | 7/2013 |
| KR | 10-2015-0000807 | 1/2015 |
| KR | 10-1696458 | 1/2017 |
| KR | 10-1725193 | 4/2017 |

OTHER PUBLICATIONS

Yong-Hwan Moon et al., "A 2.2-mW 20-135-MHz False-Lock-Free DLL for Display Interface in 0.15-μm CMOS"; IEEE Transactions on Circuits and Systems—II: Express Briefs, vol. 61, No. 8, Aug. 2014; pp. 554-558.

* cited by examiner

*Primary Examiner* — Laurence J Lee
(74) *Attorney, Agent, or Firm* — Polsinelli PC

(57) ABSTRACT

Disclosed is a clock recovery system of a display apparatus including a clock recovery unit which uses changeable option information used for recovering a clock signal and defining a duty, generates delayed clock signals having the duty corresponding to the option information in a clock training section, and outputs one of the delayed clock signals as the clock signal.

18 Claims, 13 Drawing Sheets

CLOCK RECOVERY SYSTEM OF DISPLAYS APPARATUS

BACKGROUND

1. Technical Field

The present disclosure relates to a display apparatus, and more particularly, to a clock recovery system of a display apparatus.

2. Related Art

A display apparatus includes a timing controller and a source driver in order to drive a display panel.

The timing controller transmits transmission (Tx) data containing display data. The display apparatus may include a plurality of source drivers for the display panel, and each of the source drivers generates a source signal for driving the display panel using the Tx data of the timing controller.

The Tx data communication between the timing controller and the source driver may be implemented in various manners. For example, the timing controller may transmit Tx data to the source driver through CEDS (Clock Embedded Data Signaling). The CEDS may indicate a communication scheme that packetizes the Tx data to have a format in which a clock is embedded in data, and transmits the packetized Tx data.

More specifically, the Tx data may be divided into a clocking training section containing a clock and a data section in which a clock is embedded in data.

The source driver recovers a clock signal using the clock in the clock training section, recovers the data using the recovered clock signal in the data section, and outputs a source signal using the recovered clock signal and data.

In general, the clock signal recovered by the source driver has a fixed duty.

Since the clock signal has a fixed duty, the source driver has restrictions on supporting various modes or applying various applications.

SUMMARY

Various embodiments are directed to a clock recovery system of a display apparatus, which can store and provide changeable option information used for recovering a clock signal and defining a duty, and recover the clock signal at various duties through a clock recovery unit of a source driver according to the option information.

Also, various embodiments are directed to a clock recovery system of a display apparatus, which can recover a clock signal to have a duty corresponding to option information during clock training, and express additional information, mode information and application information on recovery of a clock signal or data using the duty of the clock signal as an option.

In an embodiment, a clock recovery system of a display apparatus may include: an option source configured to store and provide changeable option information which is used for recovering a clock signal and defines a duty; and a clock recovery unit configured to receive Tx data, generate delayed clock signals having the duty corresponding to the option information using a clock in a clock training section, and output one of the delayed clock signals as the clock signal.

In another embodiment, a clock recovery system of a display apparatus may include: an option source configured to store and provide changeable option information which is used for recovering a clock signal and defines a duty; a clock extraction unit configured to receive Tx data, output a reference clock signal using a clock in a clock training section, and decide a rising point of the reference clock signal according to a mask signal; a phase detector configured to detect a phase difference between the reference clock signal and a feedback clock signal; a charge pump configured to provide a voltage control signal by performing a pull-up and pull-down operation corresponding to the phase difference, and control the level of the voltage control signal in response to the option information; and a delay line including a plurality of delay units connected in series to sequentially delay the reference clock signal, wherein the delay units output delayed clock signals corresponding to the reference clock signal and having different phases, the duties of the delayed clock signals are decided by the voltage control signal, and the mask signal, the feedback clock signal and the clock signal are selected among the delayed clock signals.

In another embodiment, a clock recovery system of a display apparatus may include: an option source configured to store and provide changeable option information which is used for recovering a clock signal and defines a duty; a clock extraction unit configured to receive Tx data, output a reference clock signal using a clock in a clock training section, and decide a rising point of the reference clock signal according to a mask signal; a phase detector configured to detect a phase difference between the reference clock signal and a feedback clock signal; a charge pump configured to perform a pull-up and pull-down operation corresponding to the phase difference, and provide a voltage control signal; and a delay line including a plurality of delay units connected in series to sequentially delay the reference clock signal, wherein the delay units output delayed clock signals corresponding to the reference clock signal and having different phases, the mask signal, the feedback clock signal and the clock signal are selected among the delayed clock signals, and the selection of the feedback clock signal for deciding the duty is controlled by the option information.

DETAILED DESCRIPTION

Figure 1:
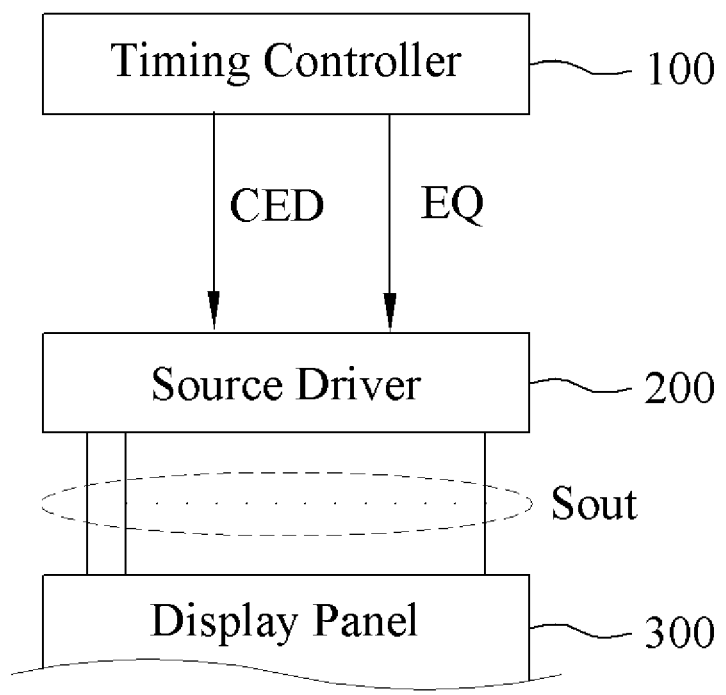
FIG. 1 is a block diagram of a display apparatus in which a clock recovery system according to an embodiment of the present invention is implemented.

Hereafter, embodiments of the present invention will be described in detail with reference to the accompanying drawings. The terms used in the present specification and claims are not limited to typical dictionary definitions, but must be interpreted as meanings and concepts which coincide with the technical idea of the present invention.

Embodiments described in the present specification and configurations illustrated in the drawings are preferred embodiments of the present invention, and do not represent the entire technical idea of the present invention. Thus, various equivalents and modifications capable of replacing the embodiments and configurations may be provided at the point of time that the present application is filed.

FIG. 1 is a block diagram of a display apparatus in which a clock recovery system according to an embodiment of the present invention is implemented.

The display apparatus according to the embodiment of the present invention includes a timing controller 100, a source driver 200 and a display panel 300.

The timing controller 100 provides Tx data CED and option information EQ to the source driver 200.

The Tx data CED may have a CEDS-based format in which a clock is embedded between data, and the clock and data may have the same amplitude.

The option information EQ may be stored in a nonvolatile memory such as an EEPROM (not illustrated) included in the timing controller 100, and provided to the source driver 200 through a transmission line separately from the Tx data CED. At this time, the timing controller 100 or the EEPROM of the timing controller 100 may be understood as an option source.

In another embodiment, the option source may include a nonvolatile memory such as an EEPROM (not illustrated) included in the source driver 200. In this case, the source driver 200 may operate using the internal EEPROM as the option source.

The option information EQ has a value defining the duty of a clock signal to recover, and indicate data which can be changed by a user. For example, the option information EQ may be expressed as digital information containing a plurality of bits such as three or four bits. When the digital information has three bits, the option information EQ may define eight options. When the digital information has four bits, the option information EQ may define 16 options.

The display apparatus may include a plurality of source drivers 200 for the timing controller 100 and the display panel 300.

The source driver 200 receives the Tx data CED and recovers a clock signal and data from the Tx data CED, and the data include display data and control data. The source driver 200 drives a source signal Sout using the clock signal, the display data and the control data, and provides the source signal Sout to the display panel 300.

The display panel 300 may include a flat display panel such as an LC (Liquid Crystal) panel, LED panel or OLED panel.

Figure 2:
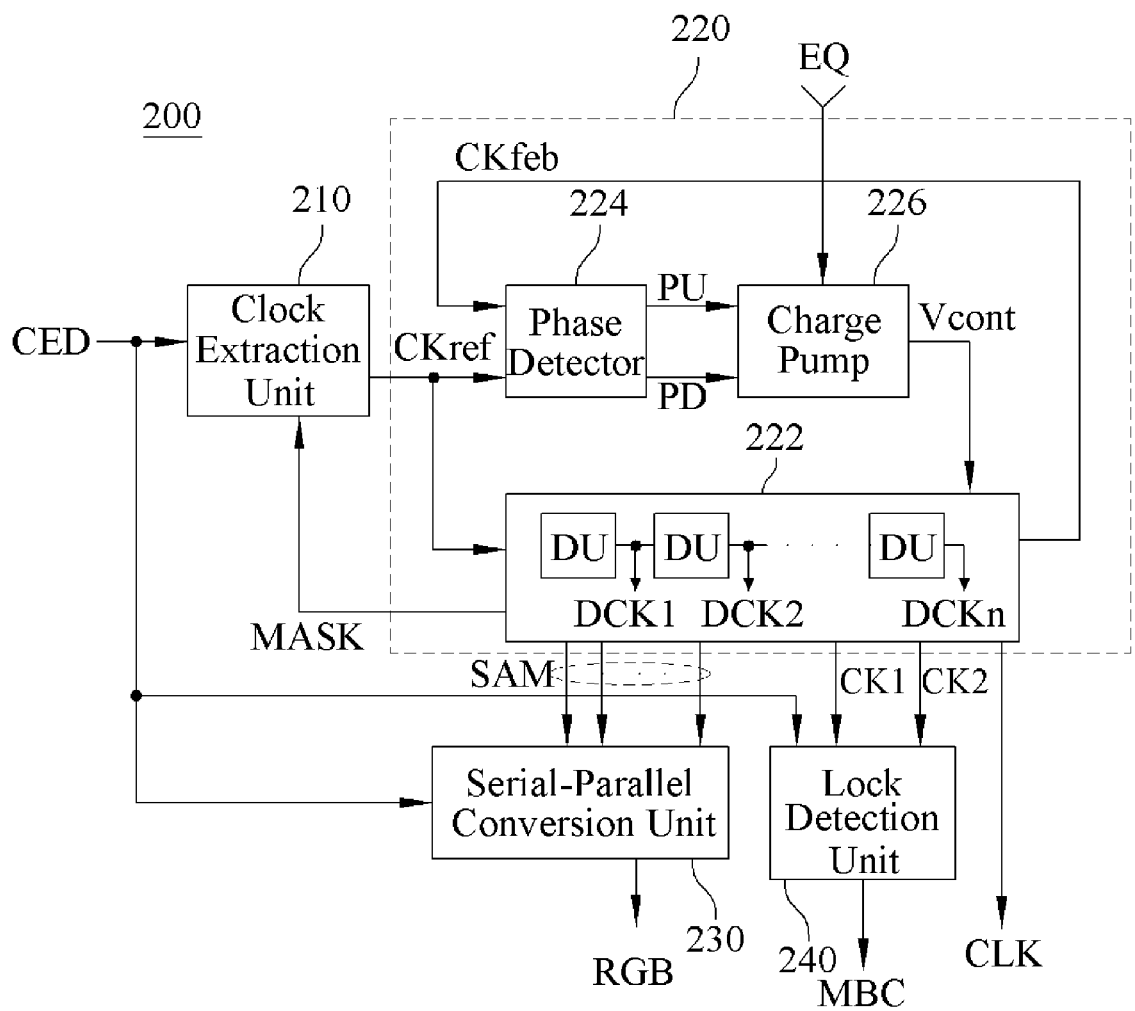
FIG. 2 is a block diagram illustrating a source driver including a clock recovery unit of FIG. 1.

The source driver 200 may have a configuration illustrated in FIG. 2, in order to recover the clock signal and the data.

Referring to FIG. 2, the source driver 200 includes a clock extraction unit 210, a DLL (Delay Locked Loop) 220, a serial-parallel conversion unit 230 and a lock detection unit 240.

The source driver 200 may further include a signal processing unit (not illustrated) configured to drive the source signal Sout using the recovered data RGB and the recovered clock signal CLK, in addition to the parts illustrated in FIG. 2. However, the configuration and descriptions of the signal processing unit are omitted herein.

In FIG. 2, the clock extraction unit 210, the DLL 220 and the lock detection unit 240 are used for recovering a clock signal, and the serial-parallel conversion unit 230 is used for recovering data.

The serial-parallel conversion unit 230 samples serial data included in the Tx data CED using delayed clock signals provided from a delay line 222 as sampling signals SAM, and outputs the recovered data RGB in parallel. The delay line 222 will be described later.

The DLL 220 includes the delay line 222, a phase detector 224 and a charge pump 226.

In the present embodiment, the clock extraction unit 210, the delay line 222, the phase detector 224 and the charge pump 226 correspond to a clock recovery unit.

The clock recovery unit receives the Tx data CED, generates delayed clock signals having a duty corresponding to option information EQ using a clock in a clock training section, and outputs one of the delayed clock signals as the clock signal CLK.

The operation of the clock recovery unit will be described in more detail.

The clock extraction unit 210 outputs a reference clock signal CKref corresponding to the clock of the Tx data CED. At this time, the clock extraction unit 210 decides a rising point of the reference clock signal CKref using a first delayed clock signal as a mask signal MASK, the first delayed clock signal being selected among the delayed clock signals DCK1 to DCKn of the delay line 222 described later. The clock extraction unit 210 may generate a pulse at a point of time that the mask signal MASK is enabled while the clock is enabled in the clock training period, in order to decide the rising point of the reference clock signal CKref. Since the configuration of the clock extraction unit 210 can be easily embodied by those skilled in the art, the detailed descriptions thereof are omitted herein.

The phase detector 224 uses a second delayed clock signal as a feedback clock signal CKfeb, the second delayed clock signal being selected among the delayed clock signals DCK1 to DCKn of the delay line 222, detects a phase difference between the reference clock signal CKref and the feedback clock signal CKfeb of the clock extraction unit 210, and outputs a pull-up control signal PU and pull-down control signal PD.

The charge pump 226 may include a push-pull circuit capable of performing typical pull-up and pull-down operations. The charge pump 226 pumps a charge through a pull-up or pull-down operation, and outputs a voltage control signal Vcont as the charge pumping result.

More specifically, the charge pump 226 may push and raise the voltage control signal Vcont through a charge pumping operation corresponding to the pull-up control signal PU, or pull and lower the voltage control signal Vcont through a charge pumping operation corresponding to the pull-down control signal PD.

Furthermore, the charge pump 226 may control the level of the voltage control signal Vcont in response to the option information EQ.

For this operation, the charge pump 226 may adjust a gain according to the option information EQ, and output the voltage control signal Vcont having a level corresponding to the gain in response to the pull-up control signal PU and the pull-down control signal PD.

More specifically, the charge pump 226 may be configured to control operations based on a first voltage for pull-up and a second voltage for pull-down according to a combination result of digital information contained in the option information EQ, adjust the pull-up control signal PU and the pull-down control signal PD according to a combination result of the digital information contained in the option information EQ, adjust output gains of transistors configured for charge pumping, or control the charge pumping result through a current mirroring method. The level of the voltage control signal Vcont may be controlled by the option information EQ through other various methods. However, the detailed illustrations and descriptions thereof are omitted herein.

The delay line 222 includes a plurality of delay units DU which are connected in series to sequentially delay the reference clock signal CKref of the clock extraction unit 210. The delay units DU of the delay line 222 output the delayed clock signals DCK1 to DCKn which are delayed to have different phases in response to the reference clock signal CKref.

At this time, each of the delay units DU may include a pair of inverters implemented with CMOS transistors. The delay units DU have a unit delay time of 1 UI for an input, and thus output the delayed clock signals DCK1 to DCKn having different phases. The duties of the delayed clock signals DCK1 to DCKn are decided by the voltage control signal Vcont. That is, the rising edges of the delayed clock signals DCK1 to DCKn are decided by the mask signal MASK, and the duties are decided by the voltage control signal Vcont.

The delay line 222 provides the first delayed clock signal of the delayed clock signals DCK1 to DCKn as the mask signal MASK, provides the second delayed clock signal as the feedback clock signal CKfeb, provides a plurality of delayed clock signals as the sampling signals SAM to the serial-parallel conversion unit 230, and provides a pair of delayed clock signals CK1 and CK2 to the lock detection unit 240 for lock detection. The first delayed clock signal, the second delayed clock signal, the sampling signals SAM and the pair of delayed clock signals CK1 and CK2 may be configured to include the same. The delay line 222 may output one delayed clock signal selected among the delayed clock signals DCK1 to DCKn as the recovered clock signal CLK.

The lock detection unit 240 compares the Tx data CED to the pair of delayed clock signals CK1 and CK2. When the pair of delayed clock signals CK1 and CK2 correspond to a preset lock condition, the lock detection unit 240 generates a lock control signal MBC for locking the recovery of the clock signal CLK.

Although not illustrated in detail, the lock control signal MBC is provided to the phase detector 224, and locks the pull-up control signal PU and the pull-down control signal PD such that the clock signal CLK is stably generated.

According to the configuration of the present embodiment, the duty of the clock signal may be decided by a plurality of options.

The duty of the clock signal CLK is defined by the option information EQ, and the clock signal CLK has a duty corresponding to the option information EQ.

The duties of the delayed clock signals DCK1 to DCKn outputted from the delay line 222 are set to the same duty. That is, the delayed clock signals DCK1 to DCKn have the same duty while having different phases. Therefore, the mask signal MASK, the sampling signals SAM, the feedback clock signal CKfeb and the clock signal CLK, which are selected among the delayed clock signals DCK1 to DCKn, may have the same duty while having a different phase difference or the same phase difference.

Hereafter, a method for deciding the duty of the clock signal CLK according to the embodiment of the present invention will be described.

Figure 3:
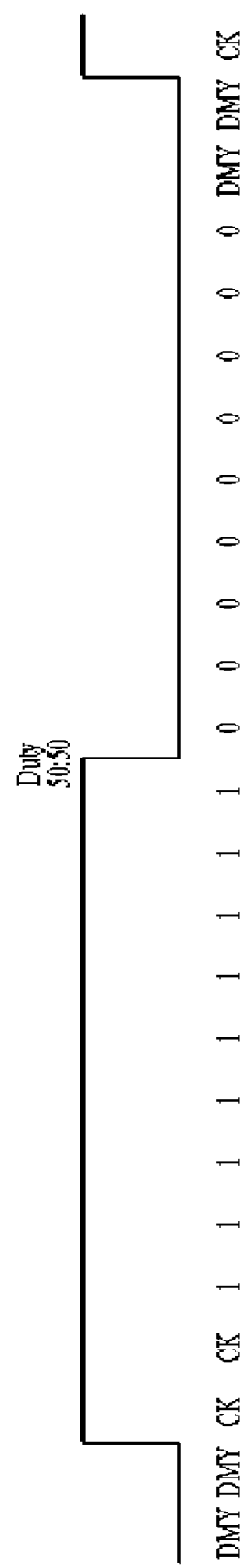
FIG. 3 is a waveform diagram illustrating a clock signal corresponding to 6-bit data and having a duty ratio of 50:50.

When the duty is fixed in the source driver 200, the clock signal CLK may have a duty ratio of 50:50 as illustrated in FIG. 3. FIG. 3 illustrates the clock signal CLK after clock training has been completed, based on 6-bit pixel data. In FIG. 3, DMY represents a dummy bit, CK represents a bit corresponding to a clock, and "1" or "0" represents a logic state of each bit.

Figure 4:
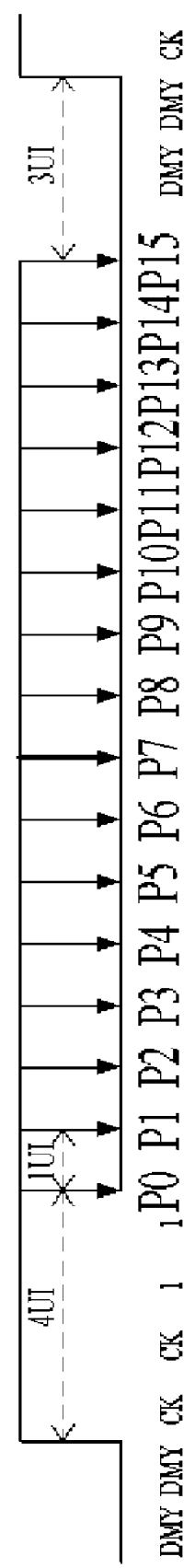
FIG. 4 is a waveform diagram illustrating a clock signal corresponding to 6-bit data and having a duty which can be changed on a basis of 1 DU through 16 options by 4-bit option information.

The clock signal CLK according to the embodiment of the present invention may have a duty corresponding to 6-bit pixel data and 16 options, and the duty may be changed on a basis of one delay unit (1 UN). The clock signal CLK may be exemplified in FIG. 4. As illustrated in FIG. 4, the option information EQ may be provided as four bits to change the duty of the clock signal CLK according to 16 options.

Referring to FIG. 4, one cycle of the clock signal CLK for 6-bit pixel data may include a total of 22 UI. When a minimum width in which the clock signal CLK is retained at a high level is expressed as 4 UI, the high-level width of the clock signal CLK may be set between a minimum of 4 UI and a maximum of 19 UI in response to the option information EQ. That is, a falling edge of the clock signal CLK may be set to any one of positions P0 to P15. Furthermore, a rising edge of the clock signal CLK may be set between the dummy bit and the clock.

In FIG. 4, when the high-level width of the clock signal CLK corresponds to the minimum width, the duty ratio of the clock signal CLK is 18:82. Moreover, when the high-level width of the clock signal CLK corresponds to the maximum width, the duty ratio of the clock signal CLK is 87:13.

In the above-described configuration, the rising edge of the clock signal CLK is decided by the mask signal MASK. That is, a rising edge of the reference clock signal CKref is applied to the delayed clock signals DCK1 to DCKn and the clock signal CLK. The rising edges of the delayed clock signals DCK1 to DCKn may have a phase difference of 1 DU.

The falling edge of the clock signal CLK is decided by the voltage control signal Vcont adjusted through the option information EQ. That is, the voltage control signal Vcont may change to 16-stage voltage levels in response to the value of the option information EQ, and the time during which the delayed clock signals DCK0 to DCKn outputted from the delay units DU of the delay line 222 are retained at a high level, that is, the duty of the clock signal CLK may be controlled in 16 stages.

The rising and falling edges of the clock signal CLK are decided as described above. When the duty of the clock signal CLK is controlled on a basis of 1 UI by the 4-bit option information EQ, the duty of the clock signal CLK may be set to one of 16 options.

Figure 5:
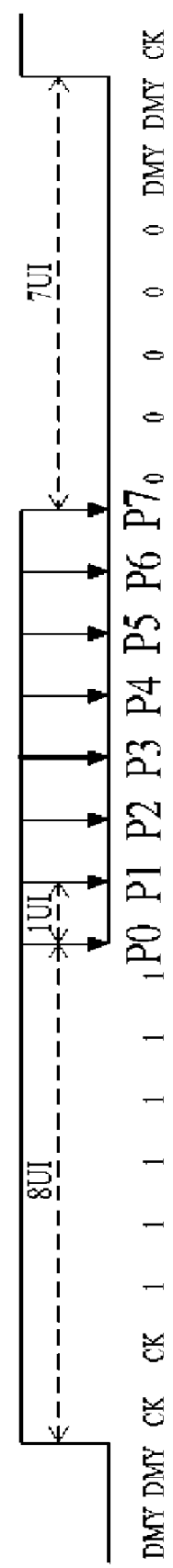
FIG. 5 is a waveform diagram illustrating a clock signal corresponding to 6-bit data and having a duty which can be changed on a basis of 2 DU through eight options by 3-bit option information.

When the duty of the clock signal CLK is controlled on a basis of 1 UI by the 3-bit option information EQ in response to 6-bit pixel data, the duty of the clock signal CLK may be set to one of eight options in FIG. 5.

Referring to FIG. 5, when a minimum width in which the clock signal CLK is retained at a high level is expressed as 8 UI, the high-level width of the clock signal CLK may be decided between a minimum of 8 UI and a maximum of 15 UI in response to the option information EQ. That is, the falling edge of the clock signal CLK may be set to any one of positions P0 to P7.

In FIG. 5, when the high-level width of the clock signal CLK corresponds to the minimum width, the duty ratio of the clock signal CLK is 36:64. Moreover, when the high-level width of the clock signal CLK corresponds to the maximum width, the duty ratio of the clock signal CLK is 78:22.

Figure 6:
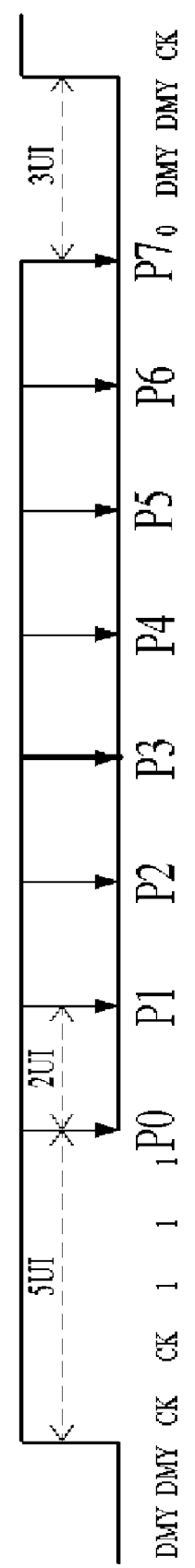
FIG. 6 is a waveform diagram illustrating a clock signal corresponding to 6-bit data and having a duty which can be changed on a basis of 2 DU through eight options by 3-bit option information.

When the duty of the clock signal CLK is controlled on a basis of 2 UI by the 3-bit option information EQ in response to the 6-bit pixel data, the clock signal CLK may be set to one of eight options in FIG. 6.

Referring to FIG. 6, when a minimum width in which the clock signal CLK is retained at a high level is expressed as 5 UI, the high-level width of the clock signal CLK may be decided between a minimum of 5 UI and a maximum of 19 UI in response to the option information EQ. That is, the falling edge of the clock signal CLK may be set to any one of positions P0 to P7.

In FIG. 6, when the high-level width of the clock signal CLK corresponds to the minimum width, the duty ratio of the clock signal CLK is 22:78. Moreover, when the high-level width of the clock signal CLK corresponds to the maximum width, the duty ratio of the clock signal CLK is 87:13.

Hereafter, the configuration in which the duty of the clock signal CLK is changed by the option information EQ in response to 8-bit pixel data according to the embodiment of the present invention will be described with reference to FIGS. 7 to 9.

Figure 7:
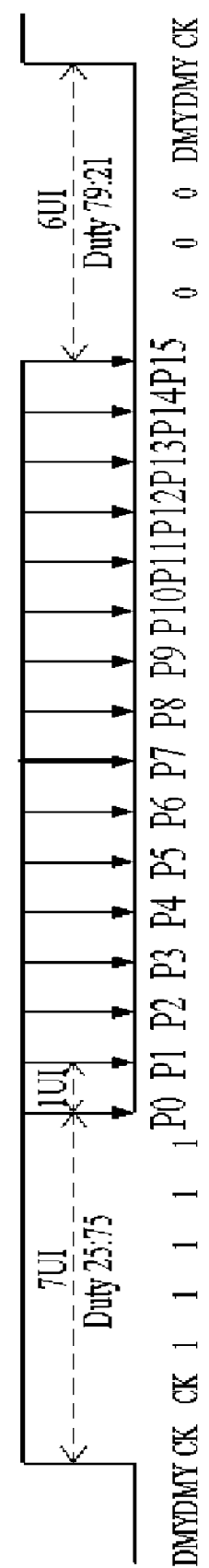
FIG. 7 is a waveform diagram illustrating a clock signal corresponding to 8-bit data and having a duty which can be changed on a basis of 1 DU through 16 options by 4-bit option information.

Referring to FIG. 7, one cycle of the clock signal CLK corresponding to 8-bit pixel data may include a total of 28 UI.

When the duty of the clock signal CLK is controlled on a basis of 1 UI by the 4-bit option information EQ in response to the 8-bit pixel data, the clock signal CLK may be set to one of 16 options in FIG. 7.

Referring to FIG. 7, when a minimum width in which the clock signal CLK is retained at a high level is expressed as 7 UI, the high-level width of the clock signal CLK may be decided between a minimum of 7 UI and a maximum of 22 UI in response to the option information EQ. That is, the falling edge of the clock signal CLK may be set to any one of positions P0 to P15.

In FIG. 7, when the high-level width of the clock signal CLK corresponds to the minimum width, the duty ratio of the clock signal CLK is 25:75. Moreover, when the high-level width of the clock signal CLK corresponds to the maximum width, the duty ratio of the clock signal CLK is 79:21.

Figure 8:
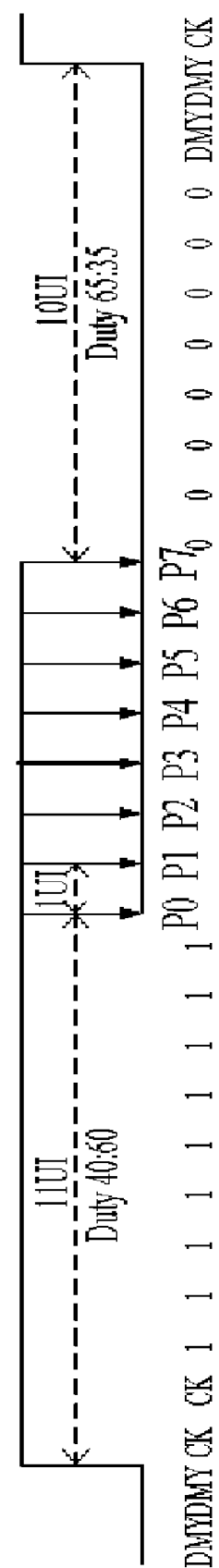
FIG. 8 is a waveform diagram illustrating a clock signal corresponding to 8-bit data and having a duty which can be changed on a basis of 1 DU through eight options by 3-bit option information.

When the duty of the clock signal CLK is controlled on a basis of 1 UI by the 3-bit option information EQ in response to 8-bit pixel data, the clock signal CLK may be set to one of eight options in FIG. 8.

Referring to FIG. 8, when a minimum width in which the clock signal CLK is retained at a high level is expressed as 11 UI, the high-level width of the clock signal CLK may be decided between a minimum of 11 UI and a maximum of 18 UI in response to the option information EQ. That is, the falling edge of the clock signal CLK may be set to any one of positions P0 to P7.

In FIG. 8, when the high-level width of the clock signal CLK corresponds to the minimum width, the duty ratio of the clock signal CLK is 40:60. Moreover, when the high-level width of the clock signal CLK corresponds to the maximum width, the duty ratio of the clock signal CLK is 65:35.

Figure 9:
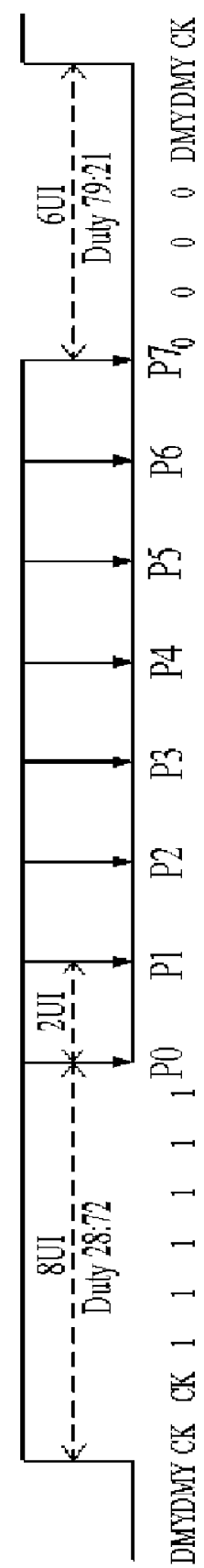
FIG. 9 is a waveform diagram illustrating a clock signal corresponding to 8-bit data and having a duty which can be changed on a basis of 2 DU through eight options by 3-bit option information.

When the duty of the clock signal CLK is controlled on a basis of 2 UI by the 3-bit option information EQ in response to the 8-bit pixel data, the clock signal CLK may be set to one of eight options in FIG. 9.

Referring to FIG. 9, when a minimum width in which the clock signal CLK is retained at a high level is expressed as 8 UI, the high-level width of the clock signal CLK may be decided between a minimum of 8 UI and a maximum of 22 UI in response to the option information EQ. That is, the falling edge of the clock signal CLK may be set to any one of positions P0 to P7.

In FIG. 9, when the high-level width of the clock signal CLK corresponds to the minimum width, the duty ratio of the clock signal CLK is 28:72. Moreover, when the high-level width of the clock signal CLK corresponds to the maximum width, the duty ratio of the clock signal CLK is 79:21.

Hereafter, a configuration in which the duty of the clock signal CLK is changed by the option information EQ in response to 10-bit pixel data according to the embodiment of the present invention will be described with reference to FIGS. 10 to 12.

Figure 10:
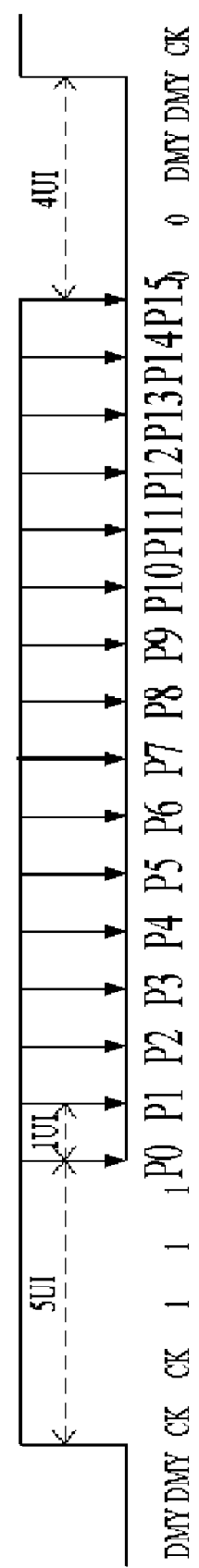
FIG. 10 is a waveform diagram illustrating a clock signal corresponding to 10-bit data and having a duty which can be changed on a basis of 1 DU through 16 options by 4-bit option information.

Referring to FIG. 10, one cycle of the clock signal CLK for 10-bit pixel data may include a total of 24 UI.

When the duty of the clock signal CLK is controlled on a basis of 1 UI by the 4-bit option information EQ in response to 10-bit pixel data, the clock signal CLK may be set to one of 16 options in FIG. 10.

Referring to FIG. 10, when a minimum width in which the clock signal CLK is retained at a high level is expressed as 5 UI, the high-level width of the clock signal CLK may be decided between a minimum of 5 UI and a maximum of 20 UI in response to the option information EQ. That is, the falling edge of the clock signal CLK may be set to any one of positions P0 to P15.

In FIG. 10, when the high-level width of the clock signal CLK corresponds to the minimum width, the duty ratio of the clock signal CLK is 20:80. Moreover, when the high-level width of the clock signal CLK corresponds to the maximum width, the duty ratio of the clock signal CLK is 16:84.

Figure 11:
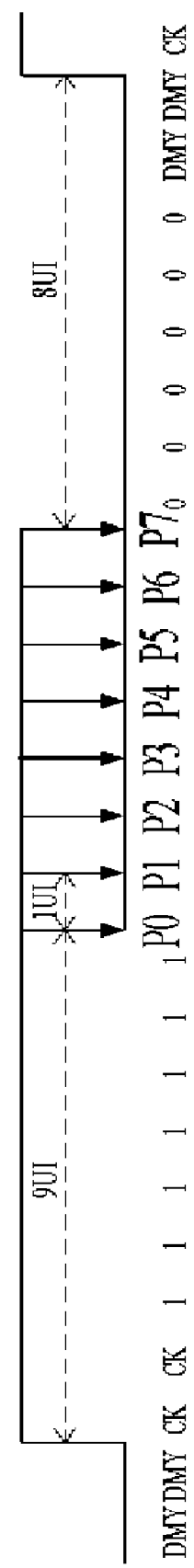
FIG. 11 is a waveform diagram illustrating a clock signal corresponding to 10-bit data and having a duty which can be changed on a basis of 1 DU through eight options by 3-bit option information.

When the duty of the clock signal CLK is controlled on a basis of 1 UI by the 3-bit option information EQ in response to the 10-bit pixel data, the clock signal CLK may be set to one of eight options in FIG. 11.

Referring to FIG. 11, when a minimum width in which the clock signal CLK is retained at a high level is expressed as 9 UI, the high-level width of the clock signal CLK may be decided between a minimum of 9 UI and a maximum of 16 UI in response to the option information EQ. That is, the falling edge of the clock signal CLK may be set to any one of positions P0 to P7.

In FIG. 11, when the high-level width of the clock signal CLK corresponds to the minimum width, the duty ratio of the clock signal CLK is 38:62. Moreover, when the high-level width of the clock signal CLK corresponds to the maximum width, the duty ratio of the clock signal CLK is 67:33.

Figure 12:
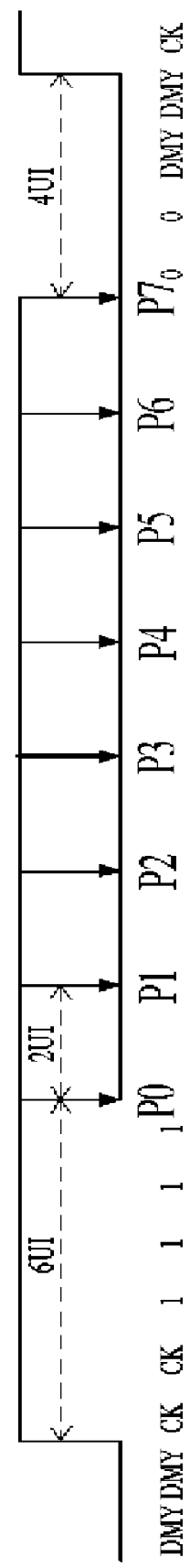
FIG. 12 is a waveform diagram illustrating a clock signal corresponding to 10-bit data and having a duty which can be changed on a basis of 2 DU through eight options by 3-bit option information.

When the duty of the clock signal CLK is controlled on a basis of 2 UI by the 3-bit option information EQ in response to the 10-bit pixel data, the clock signal CLK may be set to one of eight options in FIG. 12.

Referring to FIG. 12, when a minimum width in which the clock signal CLK is retained at a high level is expressed as 6 UI, the high-level width of the clock signal CLK may be decided between a minimum of 8 UI and a maximum of 20 UI in response to the option information EQ. That is, the falling edge of the clock signal CLK may be set to any one of positions P0 to P7.

In FIG. 12, when the high-level width of the clock signal CLK corresponds to the minimum width, the duty ratio of the clock signal CLK is 25:75. Moreover, when the high-level width of the clock signal CLK corresponds to the maximum width, the duty ratio of the clock signal CLK is 84:16.

Figure 13:
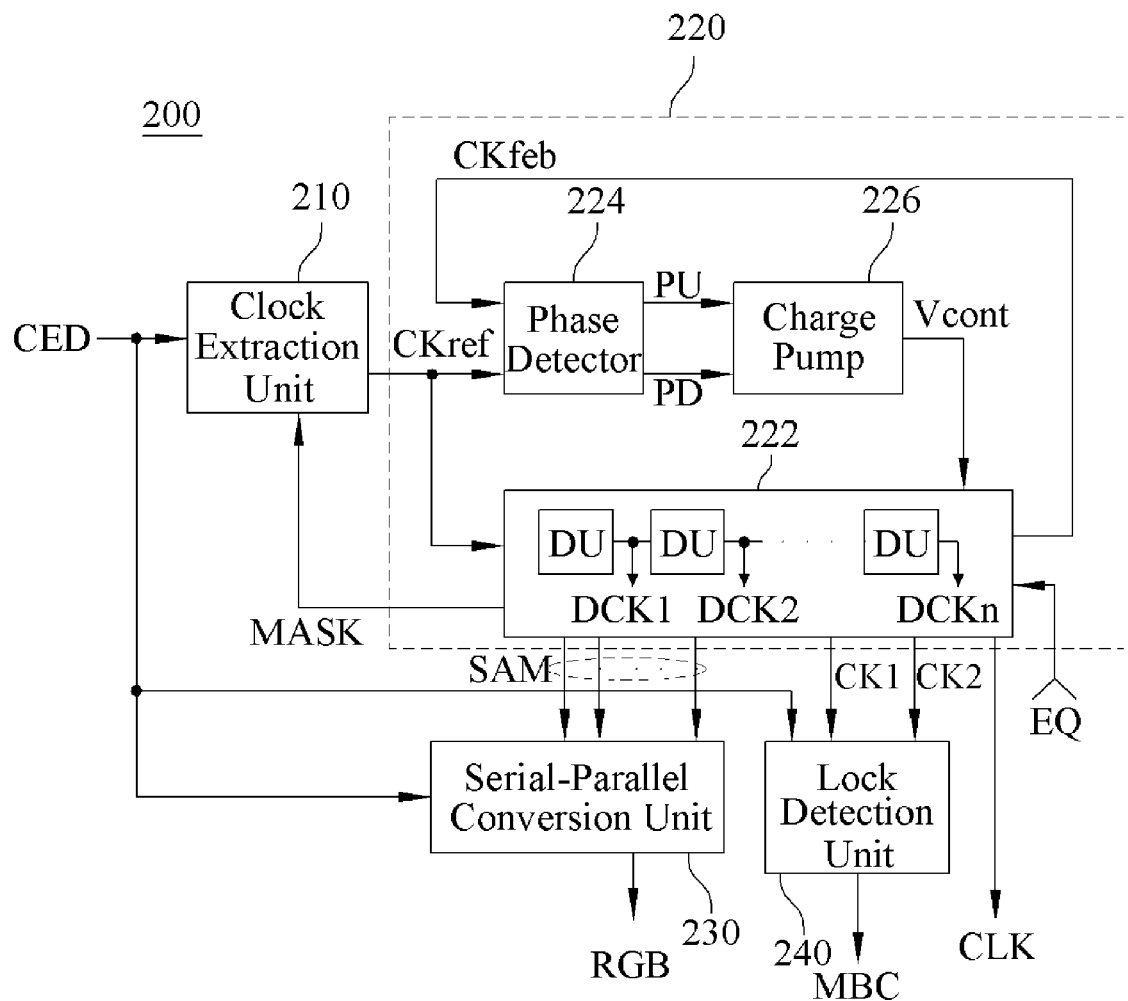
FIG. 13 is a block diagram illustrating another embodiment of the present invention.

The source driver 200 may be configured in such a manner that the option information EQ is provided to the delay line 222 as illustrated in FIG. 13, in order to recover the clock signal CLK and data.

At this time, the charge pump 226 is configured to pump a charge through pull-up or pull-down regardless of the option information EQ, and output the voltage control signal Vcont as the pumping result.

The delay line 222 of FIG. 13 selects the second delayed clock signal, that is, the feedback block signal CKfeb among the delayed clock signals DCK1 to DCKn, in response to the option information EQ. The duties of the delayed clock signals DCK1 to DCKn are decided by the feedback block signal CKfeb. This may indicate that the voltage control signal Vcont of the charge pump 226 is changed in response to a phase difference between the reference clock signal CKref and the feedback clock signal CKfeb, and the duties of the delayed clock signals DCK1 to DCKn of the delay line 222 are changed in response to changes of the voltage control signal Vcont.

That is, according to the embodiment of FIG. 13, the duties of the delayed clock signals DCK1 to DCKn and the clock signal CLK are decided by the second delayed clock signal or the feedback clock signal CKfeb which is differently selected by the delay line 222 depending on the option information EQ.

According to the embodiments of the present invention, the duty of the clock signal recovered during clock training may be changed in various manners depending on the option information. The duty of the clock signal based on the option information may be recognized and used as information on the recovery of the clock signal or data. That is, the duty of the clock signal may be used as an option in a subsequent process using the clock signal.

The source driver according to the embodiment of the present invention may be configured to control a different function related to recovery for each duty of the clock signal, or recognize the duty of the clock signal, and perform a preset function or control a preset operation.

Therefore, the duty of the clock signal may be provided as various values in response to the changed option information EQ. As a result, the source driver may support various modes, and can be applied to various applications.

While various embodiments have been described above, it will be understood to those skilled in the art that the embodiments described are by way of example only. Accordingly, the disclosure described herein should not be limited based on the described embodiments.

What is claimed is:

1. A clock recovery system of a display apparatus, comprising:
   an option source configured to store and provide option information; and
   a clock recovery unit configured to receive Tx data, generate delayed clock signals having a duty corresponding to the option information using a clock in a clock training section, and output one of the delayed clock signals as a clock signal;
   wherein the option information has a value defining the duty of the clock signal to recover and can be changed by a user, and
   wherein the clock recovery unit generates a voltage control signal in response to a phase difference between a reference clock signal corresponding to the clock of the Tx data and a feedback clock signal selected among the delayed clock signals, controls the level of the voltage control signal using the option information, and generates the delayed clock signals of which the duties are decided by the voltage control signal.

2. The clock recovery system of claim 1, wherein the option source is included in a timing controller which provides the Tx data.

3. The clock recovery system of claim 1, wherein the option source is implemented with a nonvolatile memory included in any one of a timing controller and a source driver.

4. The clock recovery system of claim 1, wherein the option source is included in a timing controller which provides the Tx data, and the option information is provided to the clock recovery unit from the timing controller through a second transmission line separate from a first transmission line for transmitting the Tx data.

5. The clock recovery system of claim 1, wherein the option information is defined as a plurality of bits, and
   the duty is changed on a basis of delay time of one or more delay units for generating the delayed clock signals, in response to a change in value of the option information.

6. The clock recovery system of claim 1, wherein the clock recovery unit comprises:
   a clock extraction unit configured to output the reference clock signal in response to the clock of the Tx data, and decide a rising point of the reference clock signal using a first delayed clock signal of the delayed clock signals as a mask signal;
   a phase detector configured to use a second delayed clock signal of the delayed clock signals as the feedback clock signal, and detect a phase difference between the reference clock signal and the feedback clock signal;
   a charge pump configured to provide the voltage control signal by performing a pull-up and pull-down operation corresponding to the phase difference, and control the level of the voltage control signal in response to the option information; and a delay line comprising a plurality of delay units connected in series to sequentially delay the reference clock signal, wherein the delay units output the delayed clock signals corresponding to the reference clock signal and having different phases, and the duties of the delayed clock signals are decided by the voltage control signal.

7. The clock recovery system of claim 6, wherein the charge pump controls the level of the voltage control signal by controlling a gain of the pull-up and pull-down operation according to the option information.

8. The clock recovery system of claim 1, wherein the option information is defined as three bits, and
the duty of the clock signal is set to one of eight options by the option information.

9. The clock recovery system of claim 1, wherein the option information is defined as four bits, and
the duty of the clock signal is set to one of 16 options by the option information.

10. The clock recovery system of claim 1, wherein the option information is defined as a plurality of bits, and
the duty of the clock signal, set by the option information, corresponds to the delay time of one or more delay units for generating the delayed clock signals.

11. A clock recovery system of a display apparatus, comprising:
an option source configured to store and provide option information; and
a clock recovery unit configured to receive Tx data, generate delayed clock signals having a duty corresponding to the option information using a clock in a clock training section, and output one of the delayed clock signals as a clock signal;
wherein the option information has a value defining the duty of the clock signal to recover and can be changed by a user, and
wherein the clock recovery unit selects a feedback clock signal among the delayed clock signals according to the option information, generates a voltage control signal in response to a phase difference between the feedback clock signal and a reference clock signal corresponding to the clock of the Tx data, and generates the delayed clock signals of which the duties are controlled by the voltage control signal.

12. The clock recovery system of claim 11, wherein the option information is defined as a plurality of bits, and
the duty is changed on a basis of delay time of one or more delay units for generating the delayed clock signals, in response to a change in value of the option information.

13. The clock recovery system of claim 11, wherein the clock recovery unit comprises:
a clock extraction unit configured to output the reference clock signal in response to the clock of the Tx data, and decide a rising point of the reference clock signal using a first delayed clock signal of the delayed clock signals as a mask signal;
a phase detector configured to use a second delayed clock signal of the delayed clock signals as the feedback clock signal, and detect a phase difference between the reference clock signal and the feedback clock signal;
a charge pump configured to perform a pull-up and pull-down operation corresponding to the phase difference, and provide the voltage control signal; and
a delay line comprising a plurality of delay units connected in series to sequentially delay the reference clock signal, wherein the delay units output the delayed clock signals corresponding to the reference clock signal and having different phases, the second delayed clock signal is selected by the option information, and the duties of the delayed clock signals are decided by the second delayed clock signal.

14. The clock recovery system of claim 11, wherein the option information is defined as a plurality of bits, and
the duty of the clock signal, set by the option information, corresponds to the delay time of one or more delay units for generating the delayed clock signals.

15. A clock recovery system of a display apparatus, comprising:
an option source configured to store and provide changeable option information which is used for recovering a clock signal and defines a duty;
a clock extraction unit configured to receive Tx data, output a reference clock signal using a clock in a clock training section, and decide a rising point of the reference clock signal according to a mask signal;
a phase detector configured to detect a phase difference between the reference clock signal and a feedback clock signal;
a charge pump configured to provide a voltage control signal by performing a pull-up and pull-down operation corresponding to the phase difference, and control the level of the voltage control signal in response to the option information; and
a delay line comprising a plurality of delay units connected in series to sequentially delay the reference clock signal, wherein the delay units output delayed clock signals corresponding to the reference clock signal and having different phases, the duties of the delayed clock signals are decided by the voltage control signal, and the mask signal, the feedback clock signal and the clock signal are selected among the delayed clock signals.

16. The clock recovery system of claim 15, wherein the option information is defined as a plurality of bits, and
the duty is changed on a basis of delay time of one or more delay units for generating the delayed clock signals, in response to a change in value of the option information.

17. A clock recovery system of a display apparatus, comprising:
an option source configured to store and provide changeable option information which is used for recovering a clock signal and defines a duty;
a clock extraction unit configured to receive Tx data, output a reference clock signal using a clock in a clock training section, and decide a rising point of the reference clock signal according to a mask signal;
a phase detector configured to detect a phase difference between the reference clock signal and a feedback clock signal;
a charge pump configured to perform a pull-up operation and pull-down operation corresponding to the phase difference, and provide a voltage control signal; and
a delay line comprising a plurality of delay units connected in series to sequentially delay the reference clock signal, wherein the delay units output delayed clock signals corresponding to the reference clock signal and having different phases, the mask signal, the feedback clock signal and the clock signal are selected among the delayed clock signals, and the selection of the feedback clock signal for deciding the duty is controlled by the option information.

18. The clock recovery system of claim 17, wherein the option information is defined as a plurality of bits, and the duty is changed on a basis of delay time of one or more delay units for generating the delayed clock signals, in response to a change in value of the option information.

* * * * *